United States Patent [19]

Makowiecki et al.

[11] Patent Number: 5,490,911

[45] Date of Patent: Feb. 13, 1996

[54] REACTIVE MULTILAYER SYNTHESIS OF HARD CERAMIC FOILS AND FILMS

[75] Inventors: Daniel M. Makowiecki, Livermore; Joseph B. Holt, San Jose, both of Calif.

[73] Assignee: The United States of America as represented by the Department of Energy, Washington, D.C.

[21] Appl. No.: 157,497

[22] Filed: Nov. 26, 1993

[51] Int. Cl.$^6$ .................................................... C23C 14/34
[52] U.S. Cl. ........................ 204/192.15; 204/192.16; 427/376.7; 427/376.8; 427/405
[58] Field of Search .................. 204/192.15, 192.16; 427/249, 255.7, 404, 405, 376.2, 376.3, 376.6, 376.7, 554, 557, 559

[56] References Cited

U.S. PATENT DOCUMENTS

| | | |
|---|---|---|
| 3,547,673 | 12/1970 | Bredzs et al. .................... 427/376.3 |
| 4,278,708 | 7/1981 | Mikkor et al. .................... 427/376.6 X |
| 4,594,294 | 6/1986 | Eichen et al. .................... 204/192.16 X |
| 5,156,725 | 10/1992 | Doktycz et al. .................... 204/192.16 |
| 5,238,711 | 8/1993 | Barron et al. .................... 427/557 X |
| 5,252,360 | 10/1993 | Huttl et al. .................... 204/192.16 X |
| 5,270,081 | 12/1993 | Manier et al. .................... 204/192.16 X |

*Primary Examiner*—Nam Nguyen
*Attorney, Agent, or Firm*—L. E. Carnahan; Henry Sartorio; William R. Moser

[57] ABSTRACT

A method for synthesizing hard ceramic materials such as carbides, borides and aluminides, particularly in the form of coatings provided on another material so as to improve the wear and abrasion performance of machine tools, for example. The method involves the sputter deposition of alternating layers of reactive metals with layers of carbon, boron, or aluminum and the subsequent reaction of the multilayered structure to produce a dense crystalline ceramic. The material can be coated on a substrate or formed as a foil which can be coild as a tape for later use.

18 Claims, No Drawings

REACTIVE MULTILAYER SYNTHESIS OF HARD CERAMIC FOILS AND FILMS

The United States Government has rights in this invention pursuant to Contract No. W-7405-ENG-48 between the United States Department of Energy and the University of California for the operation of Lawrence Livermore National Laboratory.

BACKGROUND OF THE INVENTION

The present invention relates to hard ceramic materials, particularly to a process for synthesizing hard ceramic material, and more particular to such a process that involves sputter deposition of alternating layers of reactive metals with layers of material, such as carbon, boron or aluminum and the subsequent reaction of the multilayered structure to produce a dense crystalline ceramic.

Borides and carbides are well known as hard ceramic materials commonly used for engineering applications that are subject to erosion, corrosion and high temperatures. Also, films of such ceramics and intermetallic are coated on other materials to improve their performance, such as in machine tool applications.

Ceramics, intermetallics and composites have been synthesized in exothermic chemical reactions. Normally, the reactants are blended together as powders, pressed into an appropriate shape and ignited. This causes a combustion wave to rapidly self-propagate through the reactants transforming them into the final product. The combustion synthesis of powder reactants generally produces a bulk product of coarse powders or monolithic pieces that require additional processing into a final usable form.

Where films of the ceramic and intermetallic materials are coated of other materials, several variations of two vapor deposition techniques have been used as commercial processes to apply the coating. These two vapor deposition techniques are chemical vapor deposition (CVD) and physical vapor deposition (PVD). Prior efforts to produce such films or coatings, are exemplified by the following U.S. Patents:

The Bergmann et al. U.S. Pat. No. (4,992,153 issued Feb. 12, 1991) discloses a sputter—CVD process for coating a workpiece wherein carbide containing layers, among other, are formed.

The Garg et al. U.S. Pat. No. (4,902,535 issued Feb. 20, 1990) discloses a method for depositing hard coatings on titanium or titanium alloys wherein a non-reactive noble metal interlayer is deposited using electroless platin and a hard outer coating is deposited onto that interlayer using vapor deposition techniques.

The dos Santos Pereina Ribeiro U.S. Pat. No. (4,883,574 issued Nov. 28, 1989) discloses a method of applying coatings to objects using magnetic field supported cathode sputtering in a vacuum.

The Boss U.S. Pat. No. (4,849,081 issued Jul. 18, 1989) discloses a method for forming oxide films by reactive sputtering of silicon, titanium, aluminum or tin in an oxygen-containing atmosphere.

The Haluska et al. U.S. Pat. No. (4,822,697 issued Apr. 18, 1989) discloses a method wherein one or more ceramic coatings containing silicon carbide, silicon nitrogen, or silicon carbon nitrogen are applied over a ceramified $SiO_2$ coating and a CVD or PECVD top coating is applied for further protection.

The Keem et al. U.S. Pat. No. (4,724,169 issued Feb. 9, 1988) discloses a method of producing multilayer coatings on a substrate wherein one layer may provide hardness or wear resistance. In a specific embodiment, the coatings comprise an oxidation resistance layer, a nitride layer, and a layer of disordered boron and carbon material.

The Goebel et al. U.S. Pat. No. (4,371,570 issued Feb. 1, 1983) discloses a method for producing a coated article which provides protection against hot corrosion at moderate temperatures. Physical vapor deposition can be used to produce the coating.

While the various prior art processes have served to advance this field of technology, it has been discovered that by combining two prior art processes; namely, sputter deposition and synthesis, using multilayer materials, hard ceramic foils or films can be produced. The process of this invention involves the sputter deposition of alternating layers of reactive metals with layers of carbon, boron or aluminum, and the subsequent reaction (synthesis) of the multilayered structure to produce a dense crystalline ceramic. Ceramic composites, as well as coatings on other materials, such as selected tools may be provided by this invention. The thus produced materials may also find use in extreme environments involving erosion, corrosion, wear, and high temperature.

SUMMARY OF THE INVENTION

It is an object of the present invention to provide a reactive multilayer synthesis of hard ceramic foils and films.

A further object of the invention is to provide a process for producing hard ceramic foils and films by depositing multilayers of alternating materials and the synthesizing the thus formed multilayers.

Another object of the invention is to provide a process for fabricating hard ceramic materials using a combination of sputter deposition and synthesizing techniques.

Another object of the invention is to provide a hard ceramic coating to improve the wear and abrasion performance of a material by sputter depositing multilayers of different materials and synthesizing by an exothermic chemical reaction.

Other objects and advantages of the invention will become apparent from the following description, which sets forth the principles of the invention. Basically, the invention involves a combination of known techniques; namely, sputter deposition and synthesis by exothermic chemical reactions. The invention is a method for synthesizing hard ceramic materials such as carbides, borides, and aluminides, particularly in the form of a multilayer coating on another material. The method involves sputter deposition of alternating layers of reactive metals with layers of carbon, boron, or aluminum, and the subsequent reaction of the multilayered structure to produce a dense crystalline ceramic. The coatings or films produced by this invention serve to improve wear and abrasion performance, such as in machine tools, as well as in extreme environments involving erosion, corrosion, and high temperatures. By this method mixtures of hard ceramics can be produced by varying the elemental composition of the multilayer to produce the desired stoichiometry in the reaction. Ceramic compositions that include oxides and nitrides can be produced by reacting the multilayer in oxygen or nitrogen.

DETAILED DESCRIPTION OF THE INVENTION

The present invention involves a process for synthesizing hard ceramic materials (carbides, borides, aluminides), wherein the ceramic material is produced from thin multilayer films on other materials by sputter deposition. The thus formed coating of hard ceramic materials can be used to improve the wear and abrasion performance of machine tools, for example, as well as use in extreme environments. Basically, the process involves the sputter deposition of alternating layers (thickness of 20–200Å) of reactive metals with layers of carbon, boron, or aluminum and the subsequent reaction or synthesis of the multilayered structure to produce a dense crystalline ceramic.

It is well known that ceramics, intermetallics, and composites have been synthesized in exothermic chemical reactions. Also, it is well known that films of such ceramics and intermetallics are coated on other materials by several variations of two well known vapor deposition techniques; namely, chemical vapor deposition (CVD) and physical vapor deposition (PVD).

The process of the present invention is a combination of the vapor deposition and synthesis techniques. It is a reaction or combustion synthesis of physical vapor deposited (i.e. magnetron sputtered) thin multilayered films into ceramic or intermetallic coatings. Magnetron sputtering is well known, and has been utilized to produce multilayered structures. See U.S. Pat. No. 5,203,977 issued Apr. 20, 1993 to D. M. Makowiecki et al., and U.S. application Ser. No. 08/005,122 filed Jan. 15, 1993, entitled "Magnetron Sputtering Source", now U.S. Pat. No. 5,333,726 issued Aug. 2, 1994 each assigned to the same assignee. In the initial experimental verification of this invention it was determined that the combustion of Be+C and Ti+B multilayers can be ignited at temperatures hundreds of degrees lower than for powder compacts. Furthermore, these experiments have shown that the Si+C reaction can be initiated in a multilayer structure but not as a powder compact. The enhanced reactivity probably results from the large uncontaminated interface area of the multilayers. These preliminary experiments, which show that crystalline $TiB_2$ films can be created by combustion of Ti+B multilayers, reveal the potential of this new method to synthesize ceramic coatings. Typical vacuum coating techniques such as evaporation and sputtering of these compounds directly produces amorphous films at high substrate temperatures (i.e. <1000° C.). The combustion of very thin (i.e. about 1μ) films of reactive elements (e.g. Ti,B) in a periodic multilayer structure has the promise of fabricating crystalline coatings with superior mechanical properties at modest substrate temperatures (about 500° C.). Thus, the process of this invention has both potential and demonstrated technical advantages over existing processes for applying coatings of certain ceramics and intermetallics.

The following sets forth the unique process capabilities that have been observed in the development of the reactive multilayer synthesis process for preparing hard ceramic foils and films:

1. The fabrication of crystalline hard ceramics on low temperature substrates. Low temperature substrates being defined as substrates not capable of withstanding sustained processing temperatures above ~600° C.

2. The fabrication of a dense crystalline hard ceramic, such as $TiB_2$ having a density of 4.5 gm/cc.

3. The fabrication of a hard ceramic material with very small and uniform grain structure (grain size of 100 to 10,000Å). An example of such a material is $TiB_2$, with a grain size of 1000Å and a Vicors hardness value of about 3000.

As pointed out above, combustion synthesis of powder compacts into hard ceramics and intermetallics has been previously demonstrated, and that there are several PVD and CVD techniques used commercially to apply hard ceramic coatings. However, with respect to reactive multilayer synthesis for the fabrication of hard ceramic foils or films, the application of these prior known process characteristics are unique. This combination of techniques offer a potential advantage over the prior fabrication processes because the desired mechanical properties of ceramics are achieved in dense, fine-grained microstructures (i.e. density of 4.5 for $TiB_2$, and grain size of 1000Å. Also, the ability to deposit the multilayer films on low temperature substrates, such as polymers, borosilicate glass, or low melting metals (i.e. aluminum, tin), potentially make it possible to deposit the films as a coating to any material. While the ceramic material exemplified herein is primarily $TiB_2$, it may also be NiAl, $ZrB_2$, $NbB_2$, $TAB_2$, $B_4C$, $Al_4C_3$, TiC, HfC, TaC and SiC.

The explosive reactivity of thin multilayer films is producing crystalline films is known. However, all of these prior efforts prepared the films by evaporation rather than the more flexible magnetron sputtering technique used in the process of this invention. Also, none of these prior efforts recognized the potential of this process to prepare foils and films of hard ceramics and intermetallics that could be applied as a coating to other materials.

The present invention also provides the potential of the reactive multilayer synthesis process with the capability to fabricate both dense and uniform microcrystalline ceramics on low temperature (i.e. room temperature) substrates.

Regarding exothermic reactions, most solid-solid and gas-solid 10 chemical reactions produce heat, the amount of heat produced, or the "exothermic potential", depends on the particular chemical system. The following table provides examples of various chemical systems:

TABLE I

| Reaction | Exothermic Potential (Cal/cm$^3$) | Adiabatic Temp. (C.) |
|---|---|---|
| Ti + 2B = TiB$_2$ | 4040 | 3190 |
| Ta + C = TaC | 2380 | 2700 |
| Ni + Al = NiAl | 1050 | 1700 |

If the "exothermic potential" is high enough, then upon ignition a self-propagating combustion front rapidly consumes the reactants.

The following table sets forth the characteristics of the combustion of powder reactants:

TABLE II

| | |
|---|---|
| • HIGH TEMPERATURES | (800 C.–3200 C.) |
| • HIGH VELOCITIES | (0.1–10 cm/s.) |
| • HIGH RATES OF HEATING | (up to 10$^6$ deg./s) |
| • HIGH THERMAL GRADIENTS | (up to 107 deg./cm.) |

Exothermic reactions have been previously used as instantaneous heat sources and in processes to synthesize technological materials. The present invention involves the exothermic behavior of thin multilayer films as the basis for producing hard ceramic materials, such as carbides, borides, and aluminides. Also, heat loss is an important factor in combustion reactions, and heat loss can cause a condition of "non-ignition".

Reactant contact area/unit volume is very large in multilayer films. Thus, the rate of heat generation exceeds the rate of heat loss causing self-propagating reactions.

Possible applications of the multilayer film structure include: 1) "explosive" film due to the high exothermic reaction, 2) super hard coatings or reaction product, e.g. $B_4C$ and $TiB_2$, 3) miniature fuse due to ignition of reactive film at electrical current threshold, 4) fast one cycle switch using conducting reactants and insulating products, 5) tamper proof seal, which results in ignition by thermal, mechanical, or chemical means, and 6) piezoelectric or superconducting films, due to the engineered capability in forming the multilayers. In addition, the multilayer material may be fabricated as a foil independent of the substrate which can be coiled as of tape and used at places of need.

The following sets forth a specific example of the process of this invention for producing a film, foil, or coating of a hard ceramic material composed of $TiB_2$, for example, wherein the alternating layers have a thickness in the range of 20 to 200Å.

1. Argon Sputter Gas Pressure: $1$–$20 \times 10^{-3}$ Torr.
2. Substrate: glass, sapphire, silicon, aluminum.
3. Substrate Temperature: 30° C.
4. Substrate-Sputter Source Distance: 7 cm.
5. Sputter Power: Boron, 350–450 watts Tf: Titanium, 60–200 watts DC.
6. Substrate Rotation Speed: 0.1–1.0 RPM.

It has thus been shown that the present invention provides a process involving reactive multilayer synthesis of hard ceramic foils and films, wherein sputter deposition is used to fabricate the multilayer structure from alternating layers (thickness of 20 to 200Å) of reactive material with layers of carbon, boron, or aluminum. Thus, by combining vapor deposition techniques with combustion synthesis techniques hard ceramic materials may be produced using a multilayer structure.

While specific materials, parameters, and a specific sequence of operation for carrying out an example of the process of this invention have been set forth, such is not intended to be limiting. Modifications and changes will become apparent to those skilled in the art, and it is intended that the invention be limited only by the scope of the appended claims.

We claim:

1. A process for fabricating hard ceramic material, comprising:

forming a multilayer structure of a plurality of alternating layers of a reactive metal and material selected from the group of carbon, boron, and aluminum; and reacting the thus formed multilayer structure to produce dense crystalline ceramic material.

2. The process of claim 1, wherein the alternating layers of the multilayer structure are formed by sputter deposition.

3. The process of claim 2, wherein the sputter deposition is carried out using a magnetron sputter source.

4. The process of claim 2, wherein reacting the formed multilayer structure is carried out by combustion synthesis.

5. The process of claim 1, wherein the reactive metal is selected from the group consisting of titanium, tantalum, silicon, nickel, aluminum, zirconium, halfnium, and beryllium.

6. The process of claim 1, wherein the alternating layers have a thickness in the range of 20 to 200Å.

7. The process of claim 1, wherein the alternating layers are composed of titanium and boron.

8. The process of claim 1, wherein the multilayer structure is deposited on a material to improve wear and abrasion performance.

9. The process of claim 1, wherein the multilayer structure is deposited to form a coating on material subjected to extreme environments involving erosion, corrosion or high temperature.

10. A process for the fabrication of a hard ceramic material with a very small and uniform grain structure, comprising in combination:

a magnetron deposition technique for producing a multilayer structure composed of a plurality of alternating layers of selected material; and a combustion synthesis technique for reacting the multilayer structure to produce a ceramic material having a small and uniform grain structure with a grain size in the range of 100–10,000Å.

11. The process of claim 10, wherein the alternating layers of selected material are composed of layers of a reactive metal with a layer intermediate the reactive metal layer composed of material selected from the group consisting of carbon, boron, and aluminum.

12. The process of claim 11, wherein the layers of reactive material are selected from the group consisting of titanium, tantalum, silicon, nickel, aluminum, zirconium, halfnium and beryllium.

13. The process of claim 12, wherein the alternating layers have a thickness in the range of 20 to 200Å.

14. The process of claim 13, wherein the hard ceramic material produced thereby is $TiB_2$ with a density of 2.45 gm/cc and grain size of about 1000Å.

15. A dense crystalline ceramic material produced by the claim 12.

16. The ceramic material of claim 15, selected from the group consisting of $TiB_2$, $NiAl$, $ZrB_2$, $NbB_2$, $TAB_2$, $B_4C$, $Al_4C_3$, $TiC$, $HfC$, $TaC$ and $SiC$.

17. The ceramic material of claim 15, deposited as a coating on material subjected to wear and/or extreme environments.

18. The ceramic material of claim 15, deposited as a thin foil capable of being coiled as a tape.

* * * * *